United States Patent
Sakata

(10) Patent No.: US 7,885,067 B2
(45) Date of Patent: Feb. 8, 2011

(54) HEAT RADIATION STRUCTURE OF ELECTRONIC COMPONENT AND DISPLAY DEVICE

(75) Inventor: Tatsuya Sakata, Tokyo (JP)

(73) Assignee: Sony Corporation, Tokyo (JP)

(*) Notice: Subject to any disclaimer, the term of this patent is extended or adjusted under 35 U.S.C. 154(b) by 184 days.

(21) Appl. No.: 12/251,803

(22) Filed: Oct. 15, 2008

(65) Prior Publication Data

US 2009/0135563 A1    May 28, 2009

(30) Foreign Application Priority Data

Nov. 27, 2007    (JP) .............................. 2007-306517

(51) Int. Cl.
*H05K 7/20*    (2006.01)
*F28D 15/00*    (2006.01)

(52) U.S. Cl. .................. 361/695; 165/104.33; 361/694; 361/700

(58) Field of Classification Search ................. 361/695, 361/700
See application file for complete search history.

(56) References Cited

U.S. PATENT DOCUMENTS

| | | | | |
|---|---|---|---|---|
| 5,689,403 A | * | 11/1997 | Robertson, Jr. et al. | 361/695 |
| 5,694,294 A | * | 12/1997 | Ohashi et al. | 361/679.48 |
| 6,430,042 B1 | * | 8/2002 | Ohashi et al. | 361/679.49 |
| 6,549,406 B1 | * | 4/2003 | Olesiewicz et al. | 361/695 |
| 6,816,361 B2 | * | 11/2004 | Kuo | 361/679.6 |
| 2008/0123294 A1 | * | 5/2008 | Tsai | 361/695 |
| 2009/0002951 A1 | * | 1/2009 | Legen et al. | 361/715 |

FOREIGN PATENT DOCUMENTS

| | | |
|---|---|---|
| JP | 6-350278 | 12/1994 |
| JP | 7-231190 | 8/1995 |
| JP | 2001-42779 | 2/2001 |
| JP | 2001-142574 | 5/2001 |
| JP | 2001-255962 | 9/2001 |
| JP | 2006-222254 | 8/2006 |

OTHER PUBLICATIONS

U.S. Appl. No. 12/325,059, filed Nov. 28, 2008, Sakata, et al.

* cited by examiner

*Primary Examiner*—Gregory D Thompson
(74) *Attorney, Agent, or Firm*—Oblon, Spivak, McClelland, Maier & Neustadt, L.L.P.

(57) ABSTRACT

A heat radiation structure of an electronic component of the present invention includes a main board mounted with electronic components, an upper side heat sink disposed opposite to a top face of the main board, a lower side heat sink disposed opposite to a second face of the main board, and a cooling fan connected to the upper side heat sink and the lower side heat sink.

10 Claims, 5 Drawing Sheets

HEAT RADIATION STRUCTURE OF ELECTRONIC COMPONENT AND DISPLAY DEVICE

CROSS REFERENCES TO RELATED APPLICATIONS

The present invention contains subject matter related to Japanese Patent Application JP 2007-306517 filed in the Japan Patent Office on Nov. 27, 2007, the entire contents of which being incorporated herein by reference.

BACKGROUND OF THE INVENTION

1. Field of the Invention

The present invention relates to a heat radiation structure of an electronic component and a display device.

2. Description of the Related Art

In related art, for example, in a personal computer, in order to suppress heat generation of electronic components disposed in the inside of a body thereof, it has been implemented that heat generated from a particular electronic component is transported to a cooling fan for radiating heat by using a heat pipe and the heat is radiated.

SUMMARY OF THE INVENTION

However, for example, in a display device of a small television receiver, a large number of electronic components are densely disposed in the inside of a body thereof and each electronic component individually generates heat, and therefore, a large number of heating components are mixed in the inside of the body. In such a case, when heat generation of each of the electronic components is tried to be radiated by a heat pipe, arrangement of the heat pipe becomes complicated and it is difficult to efficiently radiate heat. For this reason, particularly in the small television receiver or the like, there arises an issue in that temperature of the inside of the body of the display device becomes easy to be raised. More particularly, in the case where the electronic component are densely mounted, the electronic components are mounted on the front and rear faces of a circuit board, and therefore, there is an issue in that a heat release value becomes larger and it becomes easy to be overheated.

Furthermore, in the case where a housing is made of metal, it is assumed that the housing is overheated by the heat generation of the electronic components. In addition, in the case where the housing is made of resin, there is also assumed to be an issue in that the resin deforms and the like. Therefore, it is absolutely necessary to radiate heat due to the electronic components.

Consequently, the present invention has been made in view of the above mentioned issues, and it is desirable to provide a heat radiation structure of an electronic component and a display device, both of which are capable of efficiently radiating heat generated from an electronic component and are newly improved.

According to an embodiment of the present invention, there is provided a heat radiation structure of an electronic component, which includes: a circuit board mounted with electronic components; a first heat sink disposed opposite to a first face of the circuit board; a second heat sink disposed opposite to a second face of the circuit board; and a cooling fan connected to the first and the second heat sinks.

According to the above configuration, the first heat sink is disposed opposite to the first face of the circuit board which is mounted with the electronic components, the second heat sink is disposed opposite to the second face of the circuit board, and the cooling fan is connected to the first and the second heat sinks. Therefore, heat of the electronic components is transferred by the first and the second heat sinks on the front and rear faces of the circuit board and the heat can be radiated by the cooling fan. Furthermore, the circuit board is sandwiched by the first and the second heat sinks, and therefore, the first and the second heat sinks can have an electrostatic shield effect, and erroneous operation due to noise or the like can be suppressed.

Furthermore, there may be further included a first heat pipe disposed on the first heat sink; and a second heat pipe disposed on the second heat sink, the first and the second heat pipes having respective one ends which are located in the vicinity of the cooling fan. According to such a configuration, heat of the first and the second heat sinks is transported through the first and the second heat pipes and is sent to the cooling fan, and therefore, the heat can be efficiently radiated.

Furthermore, there may be such that the first and the second heat sinks are connected to a plurality of the electronic components on the circuit board. According to such a configuration, heat of the electronic components is transferred to the first and the second heat sinks, and therefore, it becomes possible to radiate heat due to heat generation of the electronic components.

Furthermore, there may be further included wall portions which extend from the outer edges of one side toward the other side of the first heat sink and the second heat sink and cover the sides of the circuit board. According to such a configuration, it is possible to suppress from transferring heat of the electronic components to the sides of the circuit board and to enhance an electrostatic shield effect.

According to another embodiment of the present invention, there is provided a display device which includes a body stand portion, a display portion, and a support portion that is arranged in a standing condition from the body stand portion and supports the display portion, the display device including: a circuit board provided in the inside of the body stand portion and mounted with electronic components; a first heat sink disposed opposite to a first face of the circuit board; a second heat sink disposed opposite to a second face of the circuit board; and a cooling fan connected to the first and the second heat sinks.

According to the above mentioned configuration, in the display device which includes the body stand portion, the display portion, and the support portion that is arranged in a standing condition from the body stand portion and supports the display portion, the circuit board mounted with the electronic components is provided in the inside of the body stand portion. The first heat sink is disposed opposite to the first face of the circuit board, and the second heat sink is disposed opposite to the second face of the circuit board. Then, the cooling fan is connected to the first and the second heat sinks. Therefore, heat of the electronic components is transferred by the first and the second heat sinks on the front and rear faces of the circuit board and the heat can be radiated by the cooling fan. Furthermore, the circuit board is sandwiched by the first and the second heat sinks, and therefore, the first and the second heat sinks can have an electrostatic shield effect, and erroneous operation due to noise or the like can be suppressed.

According to the present invention, it is possible to provide a heat radiation structure of an electronic component and a display device, both of which are capable of efficiently radiating heat generated from the electronic components.

DETAILED DESCRIPTION OF THE PREFERRED EMBODIMENTS

Figure 1:
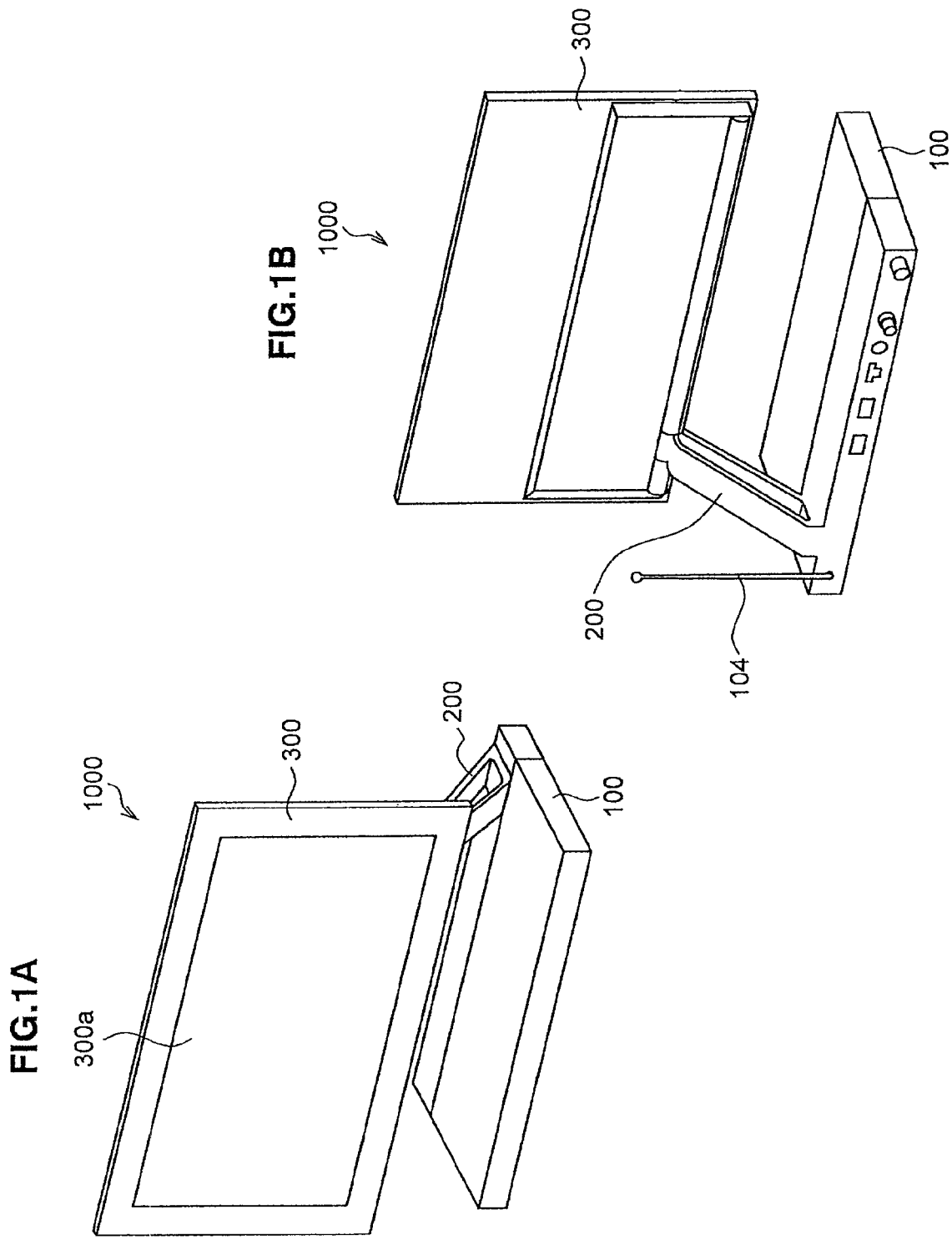
FIGS. 1A and 1B are a schematic perspective view showing an appearance of a display device according to one embodiment of the present invention.

Hereinafter, preferred embodiments of the present invention will be described in detail with reference to the appended drawings. Note that, in this specification and the appended drawings, structural elements that have substantially the same function and structure are denoted with the same reference numerals, and repeated explanation of these structural elements is omitted.

[Overall Configuration of Display Device]

Figure 2:
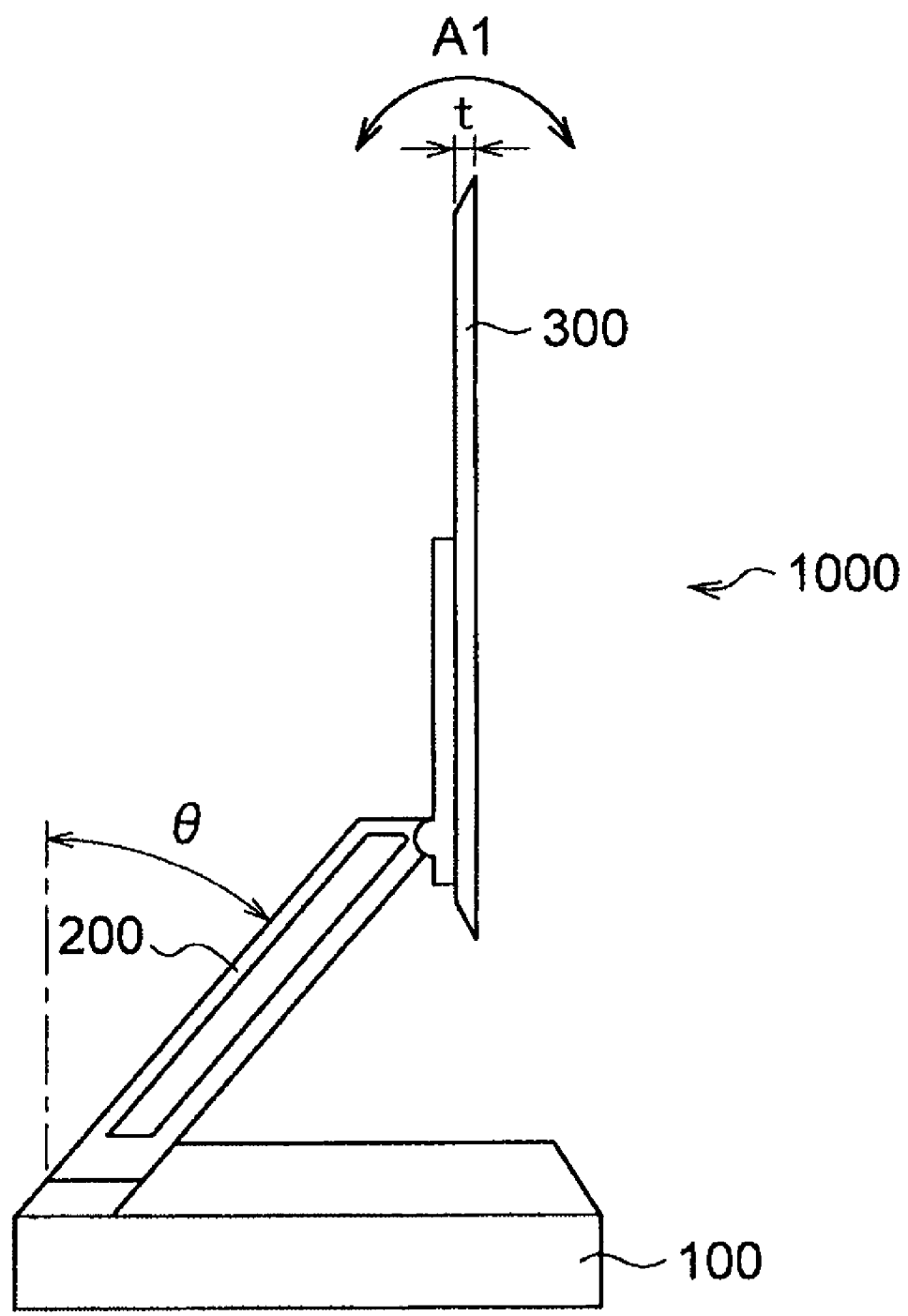
FIG. 2 is a schematic perspective view showing a state where a display device is viewed from the front left side.

FIGS. 1A and 1B are schematic perspective views showing an outer appearance of a display device 1000 according to one embodiment of the present invention. FIG. 1A is a schematic perspective view showing the display device 1000 seen from the upper right on the front surface side. FIG. 1B is a perspective view showing the display device 1000 seen from the upper right on the back surface side of the display device 1000. FIG. 2 is a schematic perspective view showing the display device 1000 seen from the left on the front surface side.

As shown in FIGS. 1A, 1B, and 2, the display device 1000 of the present embodiment is configured to include a body stand unit (body unit) 100, an arm unit (supporting unit) 200, and a display displaying unit (display unit) 300. The display device 1000 receives television broadcast pictures etc., and displays the same on a display screen 300a of the display displaying unit 300.

The display screen 300a is an organic EL (electro luminescence) that displays images using organic EL phenomenon. The display screen 300a is configured to include a plurality of organic EL elements, which are self-emitting elements, and does not include configurations such as backlight, and thus the thickness thereof can be made sufficiently thin. As shown in FIG. 2, the display displaying unit 300 of the present embodiment is a thin panel having a very thin thickness, the thickness t being suppressed to less than or equal to about a few mm (about 3 mm).

The arm unit 200 is arranged at one location on the back side of the body stand unit 100 and is arranged standing upward from the body stand unit 100. The arm unit 200 is arranged more to the right side than the center in the transverse direction (horizontal direction) of the body stand unit 100 when the display device 1000 is seen from the front surface side, and is connected on the right side than the center in the transverse direction of the display displaying unit 300. Thus, in the display device 1000 of the present embodiment, the arm unit 200 is arranged on one of the left or the right side from the center in the horizontal direction of the display displaying unit 300, and the display displaying unit 300 is supported in a cantilever manner. The arm unit 200 may be connected at the end in the horizontal direction of the display displaying unit 300. A cantilever structure may be obtained by connecting the upper end of the arm unit 200 near the center in the horizontal direction of the display displaying unit 300, and connecting the lower end to the end of the body stand unit 100 as shown in FIGS. 1A and 1B.

A backlight is necessary in the case of a liquid crystal display, and thus the thickness of the display displaying unit becomes thicker and the weight becomes heavier. In particular, considering usage for a display of displaying television pictures rather than for a computer display, greater number of backlights is arranged than in the computer display to ensure image quality as a television receiver. In addition to backlights, an inverter for controlling the backlight is also necessary in the liquid crystal display. Thus, in the case of the liquid crystal display, the weight is heavier and the rigidity of the displaying unit including the arm unit is greatly enhanced to support the display displaying unit in a cantilever manner, whereby the structure becomes complicating and the weight becomes heavier. Therefore, it is not realistic to support the liquid crystal display in a cantilever manner in view of convenience of the user, manufacturing cost, and the like.

The organic EL panel is made up of organic EL elements, which are self-emitting elements, and thus does not require backlights and configuration members such as an inverter related thereto, and can be configured light only with the panel made of thin-plate glass. Therefore, according to the present embodiment, the display displaying unit 300 itself can be configured to a very light weight, and the display displaying unit 300 can be supported in a cantilever manner.

The display displaying unit 300 is turnable in the direction of an arrow A1 in FIG. 2 with the coupling part with respect to the arm unit 200 as the center, and the user can set a tilt position of the display displaying unit 300 to a desired angle.

In the display panel of the related art, the member for supporting the display panel supports the central part in the transverse direction of the display panel from the lower side in the case of one-point support. In the case of two-point support, the vicinity of both ends in the transverse direction of the display panel is supported from the lower side. In the present embodiment, the arm unit 200 is arranged shifted from the central part in the transverse direction of the display displaying unit 300 and the display displaying unit 300 is supported in a cantilever manner, and thus the arm unit 200 is out of the view of the user, and the user can independently recognize only the display screen 300a. The user can get an impression as if the display displaying unit 300 is floating on the body stand unit 100 without the arm unit 200. The user then can independently and closely look only at the display screen 300a by supporting the display displaying unit 300 in a cantilever manner.

The degree of freedom in installing the arm unit 200 enhances since there is no need to connect the root of the arm unit 200 to the central part of the body stand unit 100. Thus, the installing position of the arm unit 200 with respect to the body stand unit 100 can be determined in view of the arrangement etc. of the internal structure of the body stand unit 100 and the substrate, and the degree of freedom of design can be enhanced. The configuring members can be arranged in the most efficient manner in view of the internal structure of the body stand unit 100, and the size of the display device 1000 can be suppressed to a minimum. Furthermore, since the arm unit 200 is not arranged at the central part of the body stand unit 100, a wide effective space can be created at the upper surface of the body stand unit 100, and the display part, the operation button, the LED display lamp etc. can be freely arranged on the upper surface of the body stand unit 100.

As shown in FIGS. 1A, 1B, and 2, the arm unit 200 is arranged inclined towards the back surface of the display displaying unit 300 from the rear side of the body stand unit 100. In FIG. 2, an inclination angle θ of the arm unit 200 with respect to a perpendicular direction is about 45 to 60°. When the display displaying unit 300 is viewed from the front surface, the arm unit 200 will be hidden behind the display displaying unit 300, thereby suppressing the arm unit 200 from being recognized in the view of the user. Therefore, the arm unit 200 can be reliably suppressed from being recognized in the view of the user according to the synergetic effect of arranging the arm unit 200 in a shifted manner from the central part of the display displaying unit 300.

The connection state of the display displaying unit 300 and the body stand unit 100 is suppressed from being directly recognized by the user since only the display displaying unit 300 and the body stand unit 100 appear in the view of the user and the arm unit 200 barely comes into view. The user thus feel as if the display displaying unit 300 is floating in space.

In the configuration of the present embodiment, the lightness of the display displaying unit 300 is emphasized and recognized by the user since the thickness of the display displaying unit 300 is very thin or about a few mm. Therefore, for the user, the display displaying unit 300 excelling in floating feeling and lightness is provided by the synergetic effect with the feeling as if the display displaying unit 300 is floating in space.

The user then can closely look at only the display content of the display displaying unit 300, which is recognized as if floating in space, and can concentrate on the display content without being distracted by other structures. A display device 1000 in which a satisfactory designability can be maintained while creating a feeling the display screen 300a is floating to the user, and in which the visibility of the display screen 300a is greatly enhanced can be provided.

[Configuration of Body Stand Portion]

Figure 3:
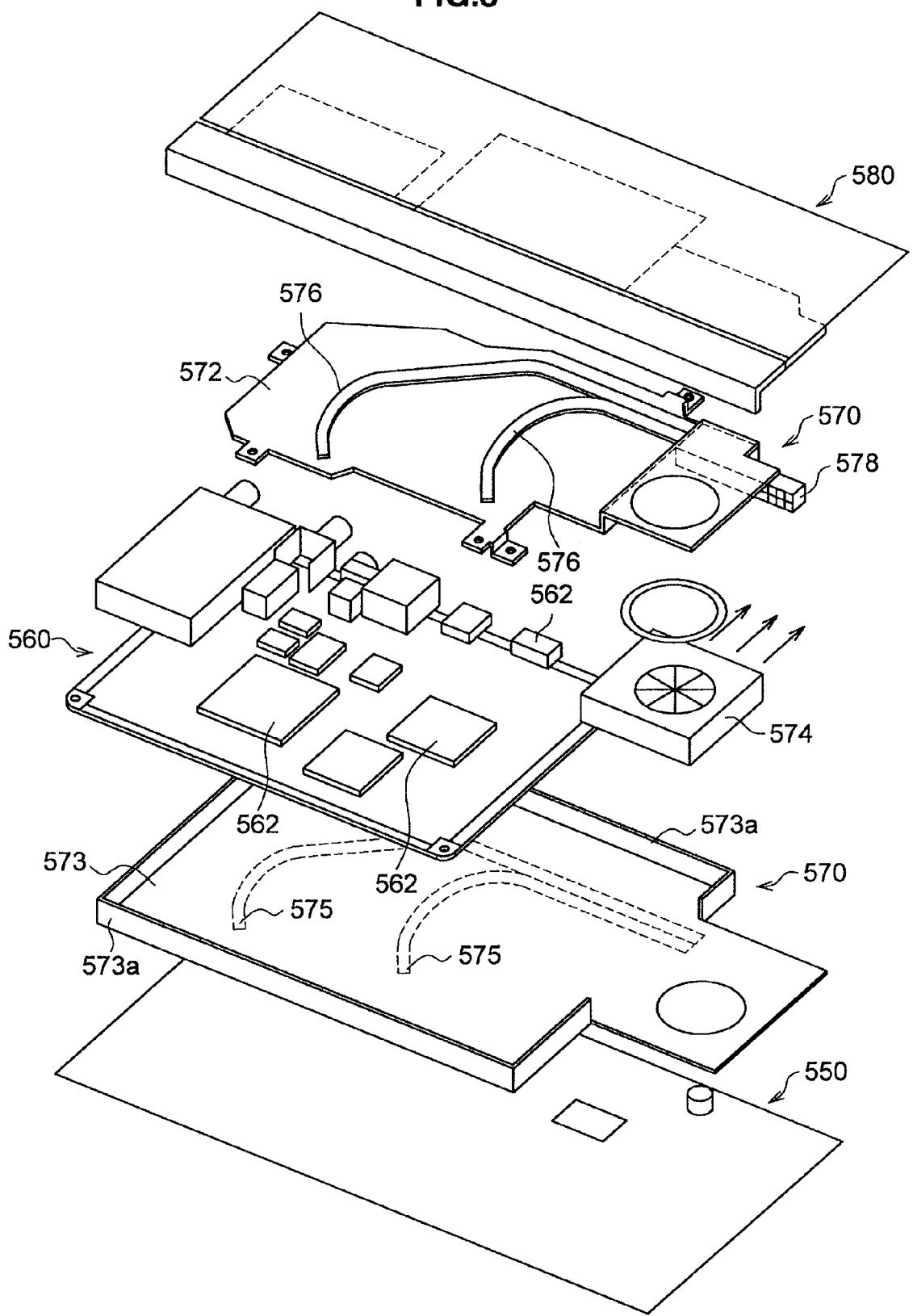
FIG. 3 is an exploded perspective view showing an internal configuration of a body stand portion.

FIG. 3 is an exploded perspective view showing an internal configuration of the body stand unit 100. The body stand unit 100 is incorporated with a tuner for satellite broadcasting (broadcasting satellite (BS), communication satellite (CS)), terrestrial digital waves, and the like, and various kinds of terminals such as a local area network (LAN), a high-definition multimedia interface (HDMI), a universal serial bus (USB). The rear face side of the body stand unit 100 is provided with a rod antenna 104 for receiving terrestrial digital waves (see FIG. 1B). Furthermore, the body stand unit 100 is provided with a speaker box, a manual operation button, and the like. As shown in FIG. 3, in the inside of the body stand unit 100, a bottom cover 550, a main board (O board) 560, a cooling unit 570, a top cover block 580 are disposed in order from the lower side.

Figure 4:
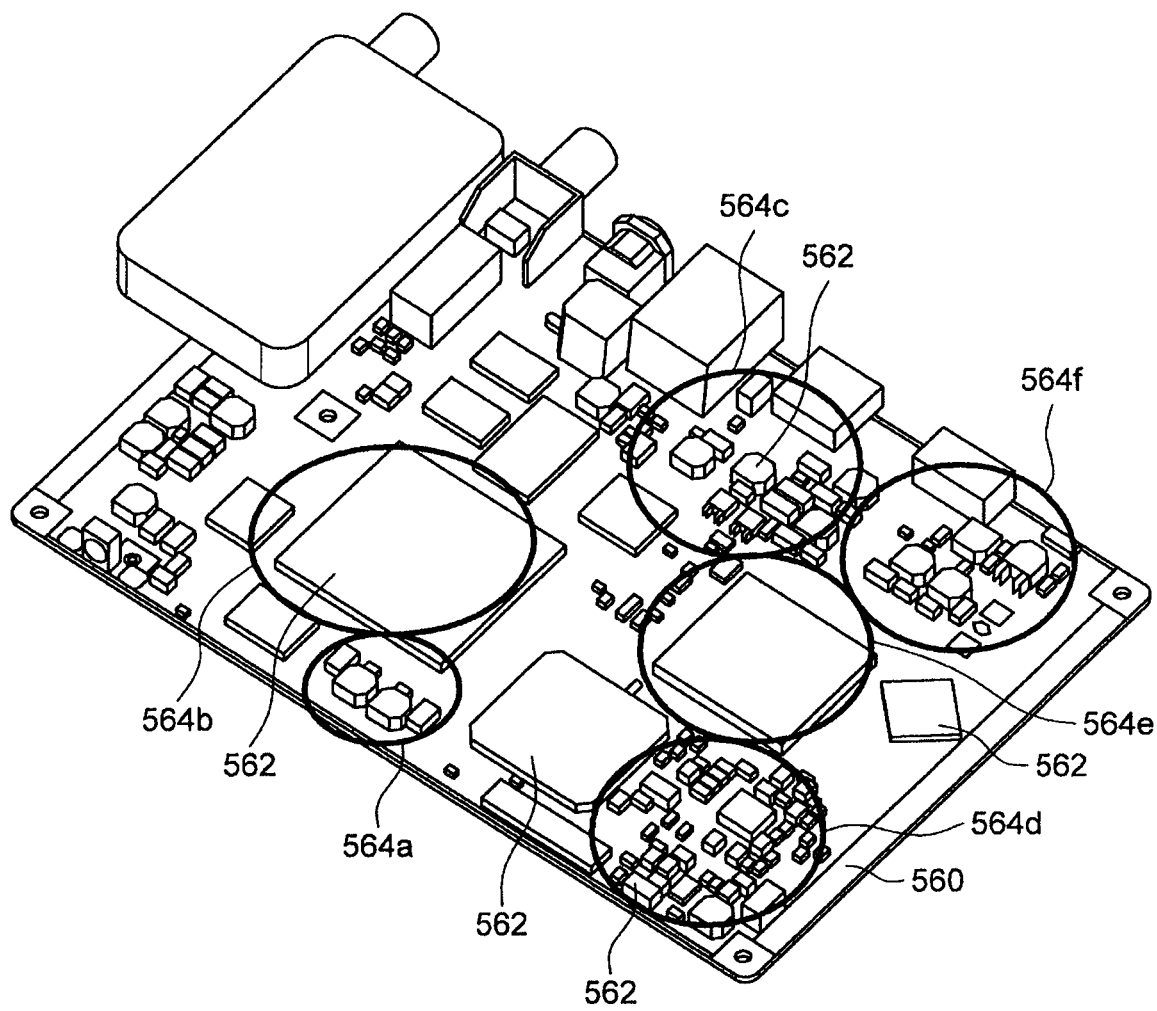
FIG. 4 is a perspective view showing a top face of a main board.

FIG. 4 is a perspective view showing a top face of the main board 560. A large number of electronic components 562 are disposed on a top face of the main board 560. Six areas of 564a, 564b, 564c, 564d, 564e, and 564f shown in FIG. 4 indicate areas where heat release values from these electronic components 562 are particularly large.

Figure 5:
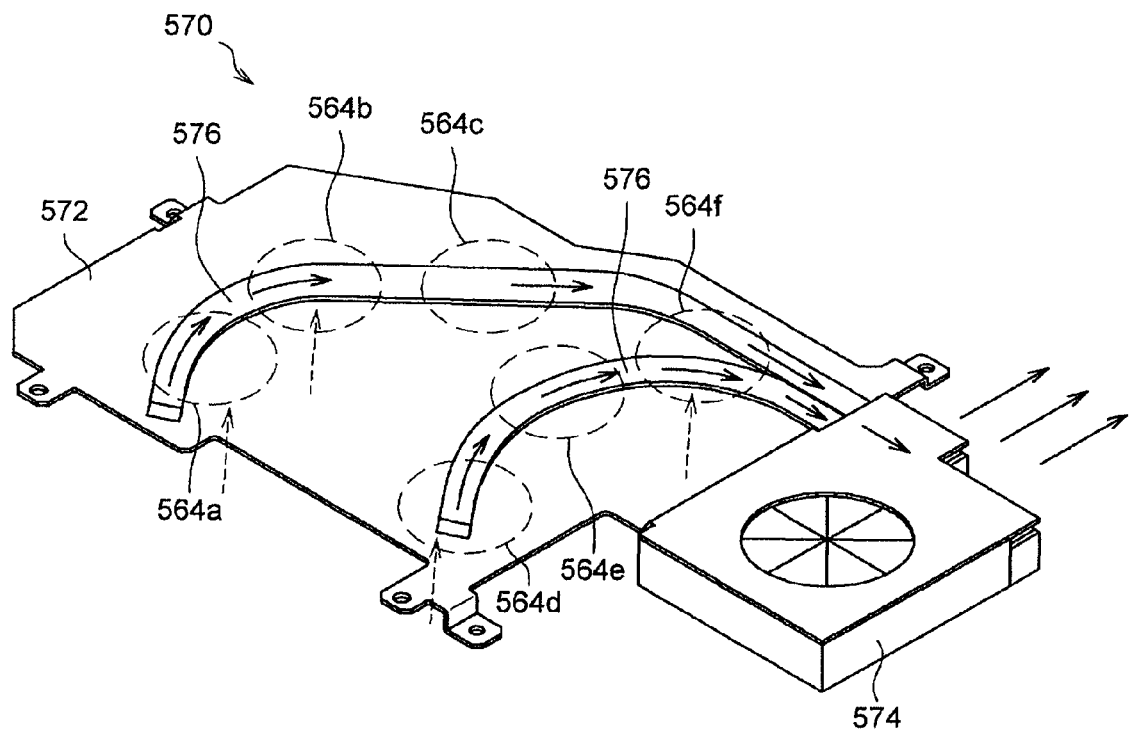
FIG. 5 is a perspective view showing an upper side heat sink and a cooling fan.

The cooling unit 570 is configured to have an upper side heat sink 572, a lower side heat sink 573, and a cooling fan 574. FIG. 5 is a perspective view showing the upper side heat sink 572 and the cooling fan 574. As shown in FIG. 5, the cooling fan 574 is attached to an undersurface of the upper side heat sink 572. In addition, in the present embodiment, one cooling fan 574 is provided, however, two cooling fans and above may be connected to the heat sink.

Furthermore, FIG. 5 shows a top face of the upper side heat sink 572 by corresponding to positions of the areas 564a to 564f shown in FIG. 4. As shown in FIG. 5, two heat pipes 576 are provided at positions corresponding to the areas 564a to 564f, and respective one ends of the heat pipes 576 are connected to the cooling fan 574. The cooling fan 574 is configured of a centrifugal fan, air drawn in from the top and the bottom is discharged to a side portion and is discharged to the outside of the body stand unit 100. In addition, thermal conductivity sheets 563 (not shown in FIG. 5) are disposed between the electronic components 562 located at the areas of 564a to 564f and the upper side heat sink 572, and these electronic components 562 come in contact with a rear face of the upper side heat sink 572 through the thermal conductivity sheets 563.

As shown in FIG. 3, the respective one ends of the heat pipes 576 are connected to a porous structure portion 578 through which the air discharged from the cooling fan 574 passes. Heat sent from the heat pipe 576 is transferred to the porous structure portion 578 and is emitted to the outside by the air discharged from the cooling fan 574.

According to the above mentioned configuration, the heat pipes 576 are disposed so as to pass above the areas of 564a to 564f, which are located on the main board 560 and have large heat release values, and therefore, heat generated by the electronic components 562 is transferred from the thermal conductivity sheets 563 to the upper side heat sink 572. Then, the heat is transferred to the heat pipes 576 and is sent to the cooling fan 574 through the heat pipe 576. Therefore, major heat generated by the main board 560 can be efficiently sent to the cooling fan 574, and the heat in the inside of the body stand unit 100 can be efficiently emitted to the outside.

Figure 6:
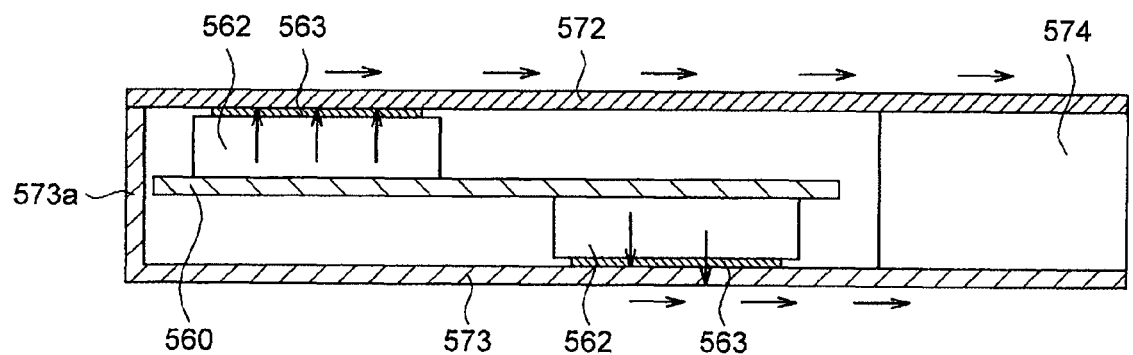
FIG. 6 is a typical view showing a state where heat generated by electronic components on the front and rear faces of the main board is sent to a cooling fan.

Electronic components are also mounted on an undersurface of the main board 560. As shown in FIG. 6, the lower side heat sink 573 is closely attached to the electronic components 562 having large heat release values through the thermal conductivity sheets 563 as in the upper side heat sink 572. Furthermore, as in the upper side heat sink 572, heat pipes 575 are disposed on an undersurface of the lower side heat sink 573; and the heat pipes 575 extend to the cooling fan 574. In a state where the upper side heat sink 572 and the lower side heat sink 573 are combined, it is configured such that the lower side heat sink 573 is in contact with the porous structure portion 578, and the heat of the lower side heat sink 573 is radiated from the porous structure portion 578.

Therefore, the heat generated by the electronic component 562 mounted on a rear face of the main board 560 is transferred from the thermal conductivity sheets 563 to the lower side heat sink 573. Then, the heat is transferred to the heat pipes 575 and is sent to the cooling fan 574 through the heat pipes 575. Therefore, the heat generated by the electronic components 562 on the front and rear faces of the main board 560 can be efficiently sent to the cooling fan 574, and the heat in the inside of the body stand unit 100 can be efficiently emitted to the outside.

The upper side heat sink 572 and the lower side heat sink 573 are fixed to the bottom cover 550 by clamping with screws together with the main board 560.

FIG. 6 is a typical view showing a state where heat generated by the electronic components 562 on the front and rear faces of the main board 560 is sent to the cooling fan 574. The heat generated by the electronic components 562 is transferred to the upper side heat sink 572 and the lower side heat sink 573 through the thermal conductivity sheets 563, and is sent to the cooling fan 574. With this configuration, also in a small television or the like on which a large number of the electronic components 562 are mounted on a small space, the heat can be efficiently radiated from the top and the bottom of the main board 560.

Furthermore, a sandwich structure is made such that the main board 560 is sandwiched by the upper side heat sink 572 and the lower side heat sink 573, and accordingly, it becomes possible to obtain an electrostatic shield effect with respect to the main board 560, and erroneous operation due to noise or the like can be suppressed.

As shown in FIG. 3, wall portions 573a which extend to the top portion are provided at the outer edges of the lower side heat sink 573. Then, the top ends of the wall portions 573a come in contact with the rear face of the upper side heat sink 572. According to such a configuration, the sides of the main board 560 are covered with the wall portions 573a, and therefore, the heat can be suppressed from being transferred to the sides of the main board 560. Furthermore, the top face and the undersurface of the main board 560 are covered with the upper side heat sink 572 and the lower side heat sink 573, and the sides of the main board 560 are covered with the wall portions 573a, and therefore, an electrostatic shield effect with respect to the main board 560 can be further enhanced.

As described above, according to the present embodiment, the upper side heat sink 572 and the lower side heat sink 573 are disposed on the top face and the undersurface of the a main board 560, and therefore, the heat generated from the electronic components 562 of the main board 560 can be suppressed from directly transferring to the housing of the body stand unit 100. Furthermore, the upper side heat sink 572 and the lower side heat sink 573 are connected to the cooling fan 574, and the heat is transferred to the cooling fan 574 by the heat pipes 575, 576 provided on the upper side heat sink 572 and the lower side heat sink 573, and therefore, the heat of the upper side heat sink 572 and the lower side heat sink 573 can be efficiently discharged from the cooling fan 574.

In addition, the above mentioned configuration shows an example in which the main board 560 is provided in one layer, however, there may be configured such that in the case where multiple layered substrates are provided, a plurality of heat sinks are provided so as to sandwich the respective substrates and heat is radiated by the cooling fan 574.

It should be understood by those skilled in the art that various modifications, combinations, sub-combinations and alterations may occur depending on design requirements and other factors insofar as they are within the scope of the appended claims or the equivalents thereof.

What is claimed is:

1. A heat radiation structure of an electronic component, comprising:
    a circuit board mounted with electronic components;
    a first heat sink disposed opposite to a first face of the circuit board;
    a second heat sink disposed opposite to a second face of the circuit board;
    a cooling fan connected to the first and the second heat sinks;
    a first heat pipe disposed on the first heat sink;
    a second heat pipe disposed on the second heat sink; and
    a porous structure disposed so that air discharged from the cooling fan passes therethrough,
    wherein the first and the second heat pipes have respective one ends which are physically connected to the porous structure.

2. The heat radiation structure of the electronic component according to claim 1,
    wherein the first and the second heat sinks are connected to a plurality of the electronic components on the circuit board.

3. The heat radiation structure of the electronic component according to claim 1, further comprising:
    wall portions that connect outer edges of the first heat sink to outer edges of the second heat sink and cover sides of the circuit board.

4. The heat radiation structure of claim 1, wherein the heat pipes transfer heat to the porous structure and the cooling fan discharges the heat from the radiation structure by the cooling fan air that passes through the porous structure.

5. The heat radiation structure according to claim 1, wherein the porous structure is attached to the second heat sink.

6. The heat radiation structure according to claim 1, wherein the cooling fan is physically connected to the second heat sink.

7. A display device which includes a body stand portion, a display portion, and a support portion that is arranged in a standing condition from the body stand portion and supports the display portion, the display device comprising:
    a circuit board provided in the inside of the body stand portion and mounted with electronic components;
    a first heat sink disposed opposite to a first face of the circuit board;
    a second heat sink disposed opposite to a second face of the circuit board;
    a cooling fan connected to the first and the second heat sinks;
    a first heat pipe disposed on the first heat sink;
    a second heat pipe disposed on the second heat sink; and
    a porous structure disposed so that air discharged from the cooling fan passes therethrough,
    wherein the first and the second heat pipes have respective one ends which are physically connected to the porous structure.

8. The display device according to claim 7, wherein the heat pipes transfer heat to the porous structure and the cooling fan discharges the heat from the radiation structure by the cooling fan air that passes through the porous structure.

9. The display device according to claim 7, wherein the porous structure is attached to the second heat sink.

10. The display device according to claim 7, wherein the cooling fan is physically connected to the second heat sink.

* * * * *